US010243169B2

(12) United States Patent
Oh et al.

(10) Patent No.: US 10,243,169 B2
(45) Date of Patent: Mar. 26, 2019

(54) ORGANIC LIGHT EMITTING DIODE DISPLAY DEVICE INCLUDING NANOPARTICLES AND METHOD OF FABRICATING THE SAME

(71) Applicant: LG Display Co., Ltd., Seoul (KR)

(72) Inventors: Young-Mu Oh, Seoul (KR); Seung-Han Paek, Bucheon-si (KR); Hyo-Dae Bae, Daegu (KR); Jeong-Won Lee, Goyang-si (KR); Heon-Il Song, Paju-si (KR); Jong-Hoon Yeo, Incheon (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/242,048

(22) Filed: Aug. 19, 2016

(65) Prior Publication Data

US 2017/0062763 A1   Mar. 2, 2017

(30) Foreign Application Priority Data

Aug. 25, 2015  (KR) .................. 10-2015-0119378

(51) Int. Cl.
*H01L 27/32*  (2006.01)
*H01L 51/52*  (2006.01)
*H01L 51/56*  (2006.01)

(52) U.S. Cl.
CPC ...... *H01L 51/5259* (2013.01); *H01L 27/3244* (2013.01); *H01L 27/3258* (2013.01);
(Continued)

(58) Field of Classification Search
CPC ............. H01L 51/5275; H01L 51/5237; H01L 51/5253; H01L 27/3258; H01L 2251/5369; H01L 33/44; H01L 33/58; H01L 51/5265
See application file for complete search history.

(56) References Cited

U.S. PATENT DOCUMENTS 7,977,676 B2 *   7/2011  Lee ............... H01L 27/1248
                                                 257/59
8,890,402 B2 *  11/2014  Mori .............. H01L 51/5268
                                                 313/501
(Continued)

FOREIGN PATENT DOCUMENTS

CN    103441138 A    12/2013
CN    104091890 A    10/2014
(Continued)

OTHER PUBLICATIONS

Machine translation, Choi, Korean Pat. Pub. No. 10-2013-0093344, KIPO, translation date: Jun. 22, 2017, all pages.*
(Continued)

*Primary Examiner* — Victoria K. Hall
(74) *Attorney, Agent, or Firm* — Fenwick & West LLP

(57) ABSTRACT

An organic light emitting diode display device includes a first substrate, a thin film transistor over the first substrate, a protection layer over the thin film transistor, a light emitting diode over the protection layer, a passivation layer over the light emitting diode, a second substrate over the passivation layer, and a plurality of polymeric nanoparticles disposed within at least one of the protection layer or the passivation layer, wherein a refractive index of the plurality of polymeric nanoparticles is different than both a refractive index of the protection layer and a refractive index of the passivation layer.

23 Claims, 5 Drawing Sheets

(52) U.S. Cl.
CPC ...... *H01L 27/3272* (2013.01); *H01L 51/5265* (2013.01); *H01L 51/5275* (2013.01); *H01L 51/56* (2013.01); *H01L 2251/5369* (2013.01)

(56) References Cited

U.S. PATENT DOCUMENTS

| | | | |
|---|---|---|---|
| 9,847,382 B2 | 12/2017 | Dai et al. | |
| 9,887,390 B2* | 2/2018 | Kim | H01L 51/5284 |
| 10,069,111 B2* | 9/2018 | Kim | H01L 51/5268 |
| 2004/0253427 A1* | 12/2004 | Yokogawa | G02B 1/10 |
| | | | 428/212 |
| 2005/0263775 A1* | 12/2005 | Ikeda | G09G 3/3291 |
| | | | 257/79 |
| 2007/0063641 A1* | 3/2007 | Cok | H01L 51/5268 |
| | | | 313/506 |
| 2007/0096642 A1* | 5/2007 | Lee | H01L 27/3244 |
| | | | 313/506 |
| 2007/0126358 A1* | 6/2007 | Okutani | B82Y 20/00 |
| | | | 313/512 |
| 2007/0290607 A1* | 12/2007 | Okada | G02B 5/1871 |
| | | | 313/504 |
| 2009/0027371 A1* | 1/2009 | Lin | G06F 3/0412 |
| | | | 345/207 |
| 2010/0249271 A1* | 9/2010 | Matyjaszewski | C08F 265/04 |
| | | | 523/205 |
| 2014/0131675 A1* | 5/2014 | Chien | H01L 51/5275 |
| | | | 257/40 |
| 2015/0008399 A1 | 1/2015 | Choi et al. | |
| 2015/0102478 A1* | 4/2015 | Suthiwongsunthorn | |
| | | | H01L 24/45 |
| | | | 257/680 |
| 2015/0255754 A1* | 9/2015 | Moon | H01L 51/5268 |
| | | | 257/89 |
| 2015/0303222 A1* | 10/2015 | Ning | G02F 1/1368 |
| | | | 257/43 |
| 2015/0303242 A1 | 10/2015 | Dai | |
| 2016/0035894 A1* | 2/2016 | Wang | H01L 29/7869 |
| | | | 257/43 |
| 2017/0125737 A1* | 5/2017 | Sakaguchi | H01L 51/5268 |
| 2018/0212197 A1* | 7/2018 | Huang | H01L 51/5203 |

FOREIGN PATENT DOCUMENTS

| | | |
|---|---|---|
| EP | 1 445 095 A1 | 8/2004 |
| EP | 1 605 531 A2 | 12/2005 |
| EP | 2 141 962 A1 | 1/2010 |
| EP | 2 214 223 A2 | 8/2010 |
| KR | 10-2013-0093344 A | 8/2013 |

OTHER PUBLICATIONS

Machine translation, Luo, Chinese Pat. Pub. No. CN 104091890, translation date: Feb. 6, 2019, Espacenet, all pages. (Year: 2019).*
European Patent Office, Search Report and Opinion, European Patent Application No. 16175134.2, dated Jan. 26, 2017, nine pages.
The State Intellectual Property Office of the People's Republic of China, First Office Action, CN Patent Application No. 201610657883.2, dated Oct. 25, 2018, 11 pages.

* cited by examiner

ORGANIC LIGHT EMITTING DIODE DISPLAY DEVICE INCLUDING NANOPARTICLES AND METHOD OF FABRICATING THE SAME

CROSS-REFERENCE TO RELATED APPLICATIONS

This application claims priority from Korean Patent Application No. 10-2015-0119378, filed on Aug. 25, 2015, in the Korean Intellectual Property Office, which is incorporated by reference herein in its entirety.

BACKGROUND

1. Technical Field

The present disclosure relates to an organic light emitting diode display device, and more particularly, to an organic light emitting diode display device including a polymeric nanoparticle and a method of fabricating the organic light emitting diode display device.

2. Discussion of Related Art

Among various flat panel displays (FPDs), an organic light emitting diode (OLED) display device has superior properties such as high luminance and low driving voltage. The OLED display device uses an emissive electroluminescent layer to realize a high contrast ratio and a thin profile, and is excellent at displaying a moving image because of a short response time of several micro seconds (μsec). Also, the OLED display device has no limitation on a viewing angle and is stable even in a low temperature. Since the OLED display device is typically driven by a low voltage of about 5V to about 15V in direct current (DC), fabrication and design of a driving circuit is easy. Further, a fabrication process for the OLED display device including a deposition and an encapsulation is simple.

The OLED display device may display an image using light emitted from a light emitting diode in each pixel region. The light emitting diode of the OLED display device will be illustrated hereinafter.

FIG. 1 is a cross-sectional view showing an organic light emitting diode display device according to a related art.

In FIG. 1, a light emitting diode ED is formed in each pixel region of an organic light emitting diode (OLED) display device 10 according to the related art. The light emitting diode ED includes a first electrode 34, an emission layer 38 and a second electrode 40.

Although not shown, the light emitting diode ED is connected to a thin film transistor (TFT) on a first substrate, and a passivation layer 42 and a second substrate 50 are formed on the light emitting diode ED.

When a voltage is applied to the first electrode 34 and the second electrode 40, an electron and a hole are supplied from the first electrode 34 and the second electrode 40 and light is emitted from the emission layer 38. The OLED display device 10 displays a gray level by controlling a current flowing through the light emitting diode ED.

The light emitted from the emission layer 38 may have various paths by transmission, refraction and reflection at interfaces among the emission layer 38, the second electrode 40, the passivation layer 42, the second substrate 50, and the external air.

The path of the light emitted from the emission layer 38 will be illustrated for an exemplary OLED display device where the first electrode 34 is a cathode, the emission layer 38 includes an organic emitting material, the second electrode 40 is a transparent anode, the passivation layer 42 includes an organic insulating material, and the second substrate 50 includes glass. The refraction at the interface between the emission layer 38 and the second electrode 40, the refraction at the interface between the second electrode 40 and the passivation layer 42 and the refraction at the interface between the passivation layer 42 and the second substrate 50 will be ignored.

The light emitted from the emission layer 38 along a normal direction of the second substrate 50 intactly passes through the second electrode 40, the passivation layer 42 and the second substrate 50 without refraction to become a first light L1 which is output by the OLED display device 10 to the exterior.

The light emitted from the emission layer 38 along a direction having a first angle with respect to the normal direction of the second substrate 50 is refracted at the interface between the second substrate 50 and external air to become a second light L2 which is output by the OLED display device 10 to the exterior.

However, the light emitted from the emission layer 38 along a direction having a second angle greater than the first angle with respect to the normal direction of the second substrate 50 is totally reflected at the interface between the second substrate 50 and the external air to become a third light L3 which is not output by the OLED display device 10 to the exterior and the third light L3 returns to the interior. (total internal reflection (TIR) mode)

The light emitted from the emission layer 38 along a direction having a third angle greater than the second angle with respect to the normal direction of the second substrate 50 is totally reflected at the interface between the passivation layer 42 and the second substrate 50 and then is totally reflected at the interface between the second electrode 40 and the passivation layer 42 to become a fourth light L4 which is not output by the OLED display device 10 to the exterior and is dissipated to a lateral surface. In addition, the light emitted from the emission layer 38 along a direction having a fourth angle greater than the third angle with respect to the normal direction of the second substrate 50 is totally reflected at the interface between the emission layer 38 and the second electrode 40 and then is totally reflected at the interface between the emission layer 38 and the first electrode 34 to become a fifth light L5 which is not output by the OLED display device 10 to the exterior and is dissipated to the lateral surface. (waveguide mode)

While the first light L1 and the second light L2 outputted by the OLED display device 10 to the exterior of the OLED display device 10 are used for an image display, the third to fifth lights L3 to L5 are not outputted by the OLED display device 10 and therefore are not used for the image display.

In the OLED display device 10 according to the related art, all of the light emitted from the emission layer 38 is not used for the image display and some of the light is dissipated by the total reflection due to difference in refractive index at the interfaces. Accordingly, the extraction (e.g., output) efficiency of the external light (or external quantum efficiency (EQE)) is less than about 20% due to the light loss.

Specifically, about 40% of the light loss is caused by the waveguide mode where the light is not output to the exterior of the OLED display device 10 and is dissipated to the lateral surface.

SUMMARY

Embodiments relate to an organic light emitting diode display device. Accordingly, one embodiment is directed to an organic light emitting diode display device and a method of fabricating the organic light emitting diode display device that substantially obviates one or more of the problems due to limitations and disadvantages of the related art.

One embodiment is an organic light emitting diode display device where an extraction efficiency of an external light is improved by forming a plurality of polymeric nanoparticles of a multiple-layered structure in a passivation layer on a light emitting diode and a method of fabricating the organic light emitting diode display device.

In addition, one embodiment is an organic light emitting diode display device where an extraction efficiency of an external light is improved and a lifetime of the organic light emitting diode display device is extended without an addition of a fabrication process and an increase of a fabrication cost by forming a passivation layer including a plurality of polymeric nanoparticles of a multiple-layered structure on a light emitting diode and a method of fabricating the organic light emitting diode display device.

Advantages and features will be set forth in part in the description, which follows and in part will become apparent to those having ordinary skill in the art upon examination of the following or may be learned from practice of the disclosure. Other advantages and features of the embodiments herein may be realized and attained by the structure particularly pointed out in the written description and claims hereof as well as the appended drawings. Aspects of an invention are defined in the appended independent claims.

There is provided an organic light emitting diode display device including: a first substrate; a thin film transistor over the first substrate; a protection layer over the thin film transistor; a light emitting diode over the protection layer; a passivation layer over the light emitting diode; and a second substrate over the passivation layer, wherein at least one of the protection layer or the passivation layer includes a plurality of polymeric nanoparticles, and wherein a refractive index of the plurality of polymeric nanoparticles is different than both a refractive index of the protection layer and a refractive index of the passivation layer.

At least one of the polymeric nanoparticles comprises a multi-layer structure having multiple layers where a refractive index of the polymeric nanoparticle having the multi-layer structure decreases toward a center of the polymeric nanoparticle.

At least one of the plurality of polymeric nanoparticles may include a nucleus at the center of the polymeric nanoparticle and a shell surrounding the nucleus, and a refractive index of the shell may be equal to or greater than a refractive index of the nucleus.

The passivation layer may include the plurality of polymeric nanoparticles.

The refractive index of the shell may be equal to or less than a refractive index of the passivation layer.

The refractive index of the passivation layer is within a range of 1.5 to 2.0, the refractive index of the shell is within a range of 1.3 to 1.7, and the refractive index of the nucleus is within a range of 1.0 to 1.5.

The nucleus may include silica and the shell may include polystyrene.

The passivation layer may include at least one of the capping layer and the sealing layer that prevents moisture from entering the light emitting diode.

The passivation layer may have a double layer including both the capping layer and the sealing layer, and the plurality of polymeric nanoparticles may be disposed in at least one of the capping layer and the sealing layer.

At least one of the plurality of polymeric nanoparticles may have a diameter equal to or smaller than about 1 μm and may have a cross-sectional shape of one of a circle and an ellipse.

There is also provided a method of fabricating an organic light emitting diode display device including: forming a thin film transistor over a first substrate; forming a protection layer over the thin film transistor; forming a light emitting diode over the protection layer; forming a passivation layer over the light emitting diode; and forming a second substrate over the passivation layer, wherein at least one of the passivation layer or the protection layer is formed to include a plurality of polymeric nanoparticles, wherein a refractive index of the plurality of polymeric nanoparticles is different than both a refractive index of the protection layer and a refractive index of the passivation layer.

At least one of the protection layer and the passivation layer including the plurality of polymeric nanoparticles may be formed through a soluble process.

In one embodiment, an organic light emitting diode display device comprises: a first substrate; a first layer over the first substrate; a light emitting diode over the first layer; a second layer over the light emitting diode; and a plurality of polymeric nanoparticles disposed within at least one of the first layer or the second layer, wherein a refractive index of the plurality of polymeric nanoparticles is different than both a refractive index of the first layer and a refractive index of the second layer.

It is to be understood that both the foregoing general description and the following detailed description are explanatory, and are intended to provide further explanation of the embodiments as claimed.

BRIEF DESCRIPTION OF THE DRAWINGS

The accompanying drawings, which are included to provide a further understanding of the disclosure, are incorporated in and constitute a part of this specification, illustrate implementations and, together with the description, serve to explain the principles of embodiments.

DETAILED DESCRIPTION

Figure 1:
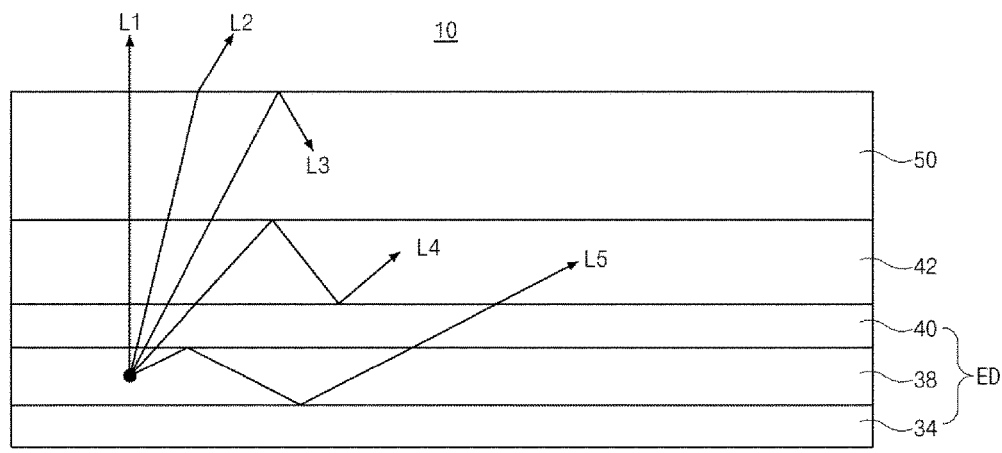
FIG. 1 is a cross-sectional view showing an organic light emitting diode display device according to a related art.

Reference will now be made in detail to embodiments, examples of which are illustrated in the accompanying drawings. In the following description, when a detailed description of well-known functions or configurations related to this document is determined to unnecessarily cloud the present disclosure, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a certain order. Like reference numerals designate like elements throughout. Names of the respective elements used in the following explanations are selected only for convenience of writing the specification and may be thus different from those used in actual products.

Figure 2:
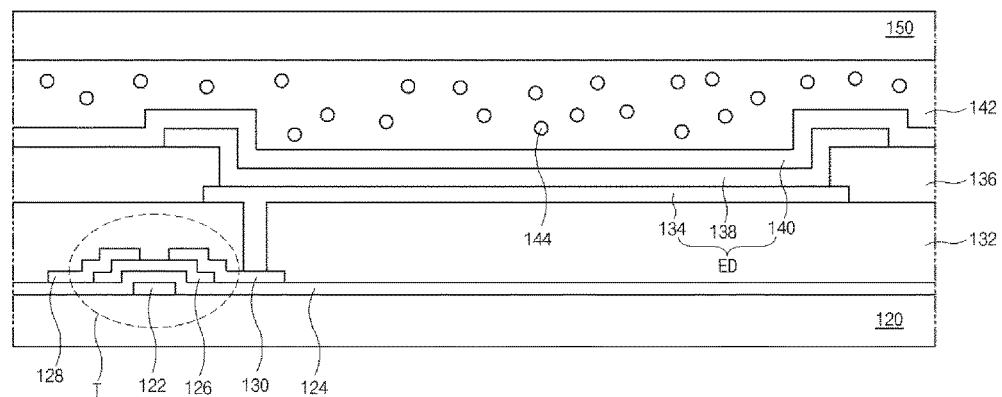
FIG. 2 is a cross-sectional view showing an organic light emitting diode display device according to an embodiment.

FIG. 2 is a cross-sectional view showing an organic light emitting diode display device according to an embodiment.

In FIG. 2, an organic light emitting diode (OLED) display device 110 includes a first substrate 120, a second substrate 150, a thin film transistor (TFT) T on the first substrate 120 and a light emitting diode (LED) ED connected to the TFT T.

The first substrate 120 and the second substrate 150 are spaced apart from each other and include a plurality of pixel regions. The first substrate 120 may be referred to as a lower substrate, a TFT substrate or a backplane, and the second substrate 150 may be referred to as an upper substrate or an encapsulation substrate.

Although not shown, a gate line, a data line and a power line crossing each other to define the pixel region may be formed on the first substrate 120. A gate electrode and a source electrode of a switching TFT may be connected to the gate line and the data line, respectively.

A semiconductor layer 126 is formed on a gate insulating layer 124 corresponding to the gate electrode 122, and a drain electrode 128 and a source electrode 130 are formed on the gate insulating layer 124 and both end portions of the semiconductor layer 126, respectively. The drain electrode 128 may be connected to a high level voltage ELVDD. The semiconductor layer 126 may include one of amorphous silicon, polycrystalline silicon, or oxide semiconductor.

A protection layer 132 is formed on the TFT T, and a light emitting diode ED is formed in each pixel region on the protection layer 132. The light emitting diode ED includes a first electrode 134, an emission layer 138 and a second electrode 140.

The first electrode 134 is formed in each pixel region on the protection layer 132 and is connected to the source electrode 130 through a source contact hole. A bank layer 136 is formed on the first electrode 134. The bank layer 136 covers an edge portion of the first electrode 134 and includes an open portion exposing a central portion of the first electrode 130.

The emission layer 138 is formed in each pixel region on the bank layer 136 and the first electrode 134 and contacts the first electrode 134 through the open portion. The emission layer 138 emits light using a hole and an electron supplied from the first and second electrodes 134 and 140. For example, the emission layer 138 may have multiple layers including a hole injecting layer (HIL), a hole transporting layer (HTL), an emitting material layer (EML), an electron transporting layer (ETL) and an electron injecting layer (EIL).

The second electrode 140 is formed on the entire surface of the first substrate 120 having the emission layer 138.

A passivation layer 142 is formed on the entire surface of the first substrate 110 having the second electrode 140 of the light emitting diode ED. The passivation layer includes a plurality of polymeric nanoparticles (PN) 144. The passivation layer 142 may include at least one of a capping layer or a sealing layer. In addition, the passivation layer may have a refractive index within a range of about 1.5 to about 2.0.

The plurality of polymeric nanoparticles (PN) 144 have a refractive index that is different than a refractive index of the passivation layer 142 in one embodiment.

Figure 6:
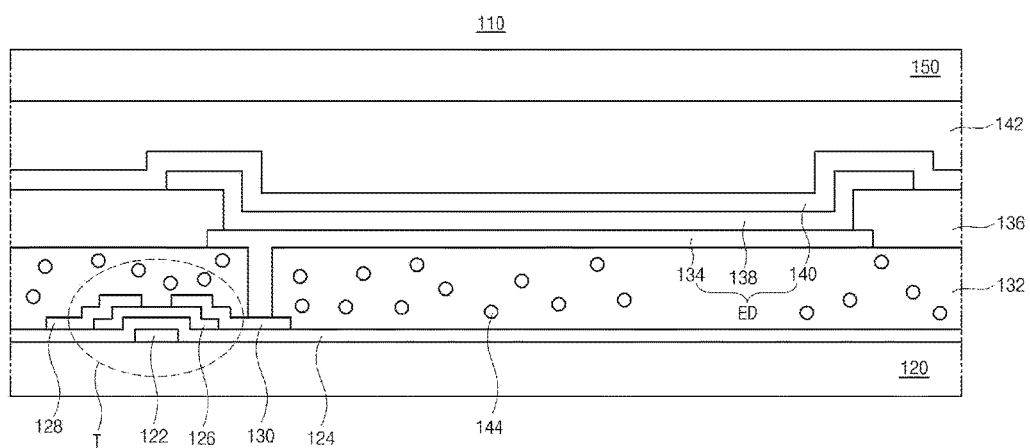
FIG. 6 is a cross-section view showing a double layer structure of a passivation layer.

The capping layer may include an organic insulating material to protect the second electrode 140. The sealing layer may include an adhesive material to attach the first substrate 120 and the second substrate 150, to prevent penetration of external moisture and external contaminants into the LED ED and to absorb an external impact. As shown in FIG. 6 when the passivation layer 142 has a double layer of the capping layer 142a and the sealing layer 142b. In this case, the plurality of polymeric nanoparticles 144 may be formed in both of the capping layer and the sealing layer or may be selectively formed in one of the capping layer or the sealing layer.

Each of the plurality of polymeric nanoparticles 144 may have a diameter equal to or smaller than about 1 μm and may have a cross-sectional shape of a circle or an ellipse. In addition, the plurality of polymeric nanoparticles 144 may have a volume ratio of about 10% to about 25% with respect to either the passivation layer 142 or the protection layer 132. When each of the plurality of polymeric nanoparticles 144 has a diameter greater than about 1 μm, a wavelength of an incident light is changed due to a scattering at a surface of each of the plurality of polymeric nanoparticles 144. As a result, a color may be dispersed and clarity of a color may be deteriorated. In addition, since a volume ratio of the plurality of polymeric nanoparticles 144 in the passivation layer 142 excessively increases over about 25%, a path of a light emitted from a front of the OLED display device 110 is changed toward a stray direction. As a result, extraction (e.g., output) efficiency of external light or luminance may not be improved. Accordingly, reduction in the clarity of a color, reduction in the extraction efficiency of an external light and reduction in the luminance are prevented due to the plurality of polymeric nanoparticles 144 having a diameter equal to or smaller than about 1 μm.

Each of the plurality of polymeric nanoparticles 144 may have a multiple layer where a refractive index decreases toward a center thereof. For example, each of the plurality of polymeric nanoparticles 144 may have a double layer including a central nucleus 146 (of FIG. 4) having a refractive index within a range of about 1.0 to about 1.5 and a shell 148 (of FIG. 4) wrapping the nucleus 146 and having a refractive index within a range of about 1.3 to about 1.7. The nucleus 146 may include silica and the shell 148 may include polystyrene in one embodiment.

After the plurality of polymeric nanoparticles 144 are mixed with a passivation material, a passivation material layer may be formed on the second electrode 140 through a soluble process such as a coating and a printing. The passivation layer 142 including the plurality of polymeric nanoparticles 144 may be formed through a subsequent dry step or a subsequent curing step.

Since each of the plurality of polymeric nanoparticles 144 has a multiple layer where a refractive index decreases toward a center, the light emitted from the emission layer 138 is refracted toward a front of the OLED display device 110 by the plurality of polymeric nanoparticles 144. As a result, extraction efficiency of an external light is improved.

When a voltage is applied to the first electrode 134 and second electrode 140, an electron and a hole are supplied from the first electrode 134 and second electrode 140 and light is emitted from the emission layer 138. The OLED display device 110 displays a gray level by controlling a current flowing through the light emitting diode ED.

In the OLED display device 110, the path of the light emitted from the emission layer 138 is changed by the plurality of polymeric nanoparticles 144 and extraction efficiency of an external light is improved.

Figure 3:
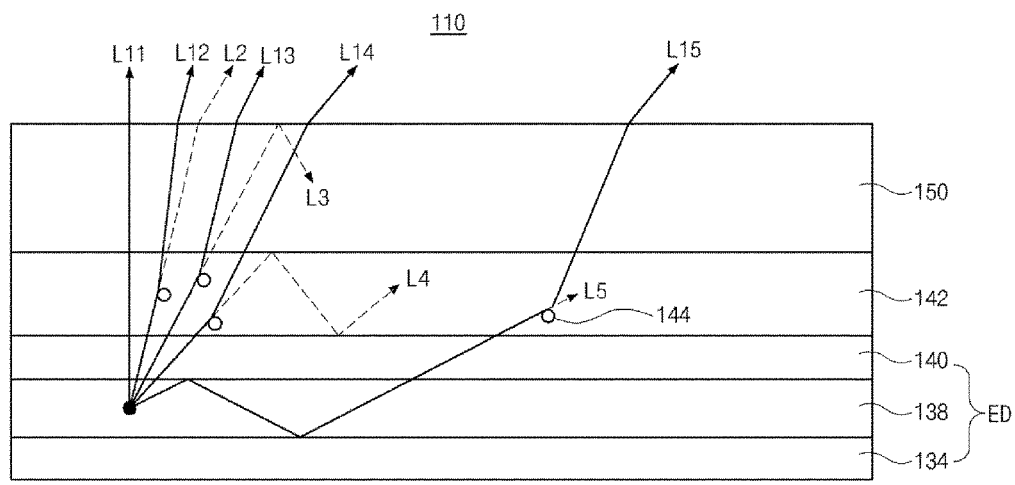
FIG. 3 is a cross-sectional view showing a light emitting diode of an organic light emitting diode display device according to an embodiment.

FIG. 3 is a cross-sectional view showing a light emitting diode of an organic light emitting diode display device according to an embodiment of the present disclosure.

In FIG. 3, light emitted from an emission layer 138 may have various paths by transmission, refraction and reflection at interfaces among the emission layer 138, the second electrode 140, the passivation layer 142, the second substrate 150, and external air.

The path of the light emitted from the emission layer 138 will be illustrated for an exemplary OLED display device where the first electrode 134 is a cathode, the emission layer 138 includes an organic emitting material, the second electrode 140 is a transparent anode, the passivation layer 142 includes an organic insulating material, each of a plurality of polymeric nanoparticles 144 includes a nucleus 146 and a shell 148, and the second substrate 150 includes glass.

A refractive index of the passivation layer 142 may be equal to or greater than a refractive index of the second electrode 140, a refractive index of the shell 148 of each of the plurality of polymeric nanoparticles 144 may be equal to or smaller than a refractive index of the passivation layer 142, and a refractive index of the nucleus 146 of each of the plurality of polymeric nanoparticles 144 may be equal to or smaller than a refractive index of the shell 148 of each of the plurality of polymeric nanoparticles 144.

For example, the emission layer 138 may have a refractive index of about 1.7, the second electrode 140 may include indium tin oxide (ITO) having a refractive index of about 1.8, the shell 148 of each of the plurality of polymeric nanoparticles 144 may have a refractive index within a range of about 1.3 to about 1.7, and the nucleus 146 of the plurality of polymeric nanoparticles 144 may have a refractive index within a range of about 1.0 to about 1.5.

The light emitted from the emission layer 138 along a normal direction of the second substrate 150 intactly passes through the second electrode 140, the passivation layer 142 and the second substrate 150 without refraction to become first light L11 which is output by the OLED display device 110 to the exterior.

The light emitted from the emission layer 138 along a direction having a first angle with respect to the normal direction of the second substrate 150 is refracted at the interface between the second substrate 150 and the external air to become a second light L12 which is output by the OLED display device 110 to the exterior.

In addition, some of the light emitted from the emission layer 138 along a direction having a second angle greater than the first angle with respect to the normal direction of the second substrate 150 is refracted by the plurality of polymeric nanoparticles 144 to be propagated along a direction having a third angle smaller than the second angle with respect to the normal direction of the second substrate 150 and then is refracted at the interface between the second substrate 150 and the external air to become a third light L13 which is output by the OLED display device 110 to the exterior.

Some of the light emitted from the emission layer 138 along a direction having a fourth angle greater than the second angle with respect to the normal direction of the second substrate 150 is refracted by the plurality of polymeric nanoparticles 144 to be propagated along a direction having a fifth angle smaller than the second angle with respect to the normal direction of the second substrate 150 and then is refracted at the interface between the second substrate 150 and the external air to become a fourth light L14 which is output by the OLED display device 110 to the exterior.

Other light emitted from the emission layer 138 along a direction having the second angle is totally reflected at the interface between the second substrate 150 and the external air to become the third light L3 of the related art which is not output by the OLED display device 110 to the exterior and returns to the interior. Further, other light emitted from the emission layer 138 along a direction having the fourth angle is totally reflected at the interface between the passivation layer 142 and the second substrate 150 and then is totally reflected at the interface between the second electrode 140 and the passivation layer 142 to become the fourth light L4 of the related art which is not output by the OLED display device 110 to the exterior and is dissipated to a lateral surface.

However, the OLED display device 110 uses all of the first to fourth lights L11, L12, L13 and L14 output to the exterior for displaying an image differently from the OLED display device 10 of the related art. Since the OLED display device 110 according to an embodiment of the present disclosure uses a larger amount of light emitted from the emission layer 138 for displaying an image as compared with the OLED display device 10 of the related art, the light loss is minimized and the extraction efficiency of the external light equal to or greater than about 50% is obtained.

A path of a light emitted from the emission layer 138 and entering the plurality of polymeric nanoparticles 144 will be illustrated hereinafter.

Figure 4:
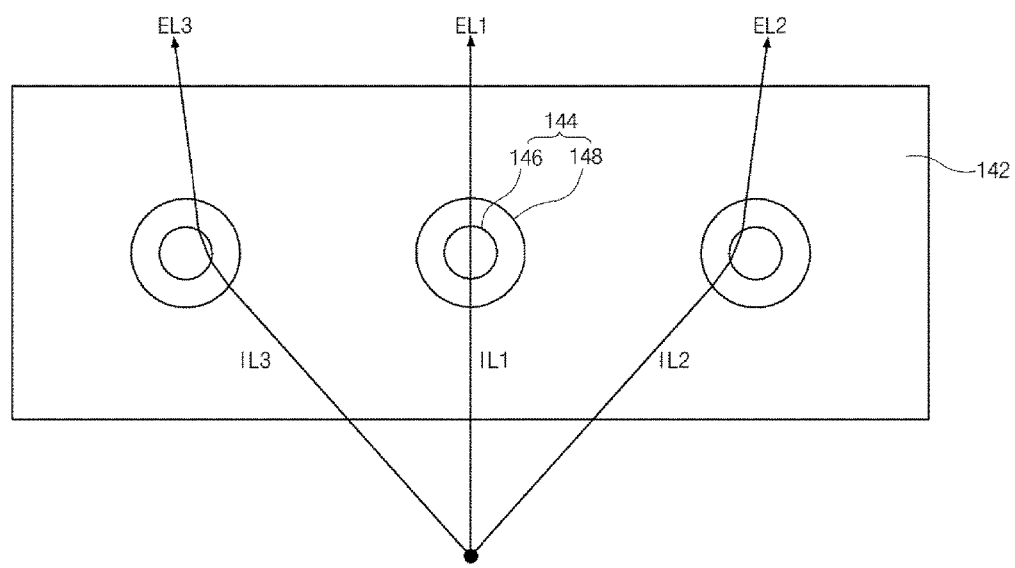
FIG. 4 is a cross-sectional view showing a passivation layer of an organic light emitting diode display device according to an embodiment.

FIG. 4 is a cross-sectional view showing a passivation layer 142 of an organic light emitting diode display device 110 according to an embodiment of the present disclosure.

In FIG. 4, a passivation layer 142 includes a plurality of polymeric nanoparticles 144, and each of the plurality of polymeric nanoparticles 144 includes a nucleus 146 and a shell 148 wrapping the nucleus 146. A refractive index of the passivation layer 142 is equal to or greater than a refractive index of the shell 148, and a refractive index of the shell 148 is equal to or greater than a refractive index of the nucleus 146.

A first incident light IL1 emitted from the emission layer 138 and perpendicularly entering the polymeric nanoparticle 144 intactly passes through the polymeric nanoparticle 144 without refraction to become a first emission light EL1 emitted along a normal direction of the passivation layer 142.

Further, second incident light IL2 and third incident light IL3 emitted from the emission layer 138 and obliquely entering the polymeric nanoparticle 144 at right and left are refracted at an interfaces between the passivation layer 142 and the shell 148, an interface between the shell 148 and the nucleus 146, an interface between the nucleus 146 and the shell 148 and an interface between the shell 148 and the passivation layer 142 according to Snell's Law while passing through the polymeric nanoparticle 144.

Since the refractive index of the passivation layer 142 is equal to or greater than the refractive index of the shell 148 and the refractive index of the shell 148 is equal to or greater than the refractive index of the nucleus 146, the second and third incident lights IL2 and IL3 are refracted toward the normal direction of the passivation layer 142 to become second emission light EL2 and third emission light EL3, respectively.

Since the incident lights obliquely entering the polymeric nanoparticle 144 with various incident angles are refracted and emitted toward a front of the OLED display device 110 by the polymeric nanoparticle 144, the extraction efficiency of the external light of the OLED display device 110 is improved and the lifetime of the OLED display device 110 is elongated.

Figure 7:
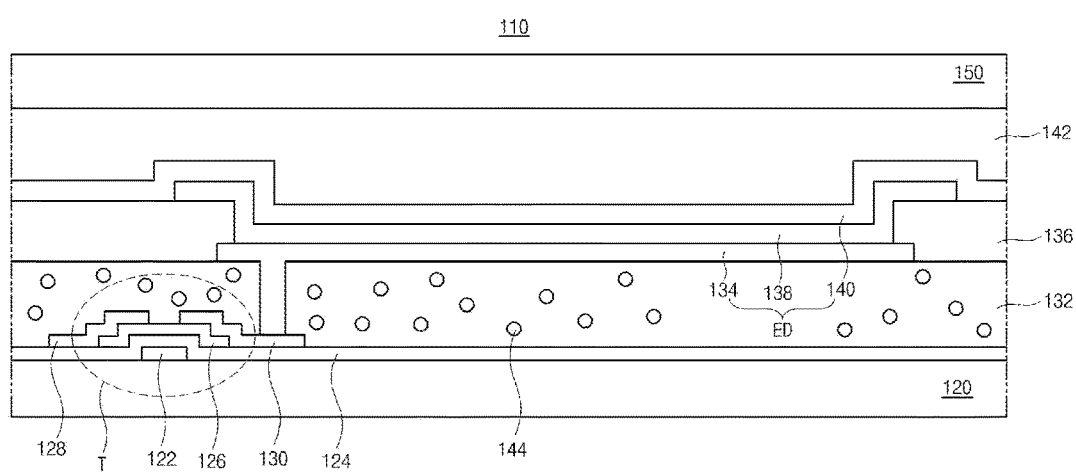
FIG. 7 is a cross-section view showing an organic light emitting diode display device according to another embodiment.

Although a top emission type OLED display device where the light of the emission layer 138 is emitted through the second electrode 140 is exemplarily illustrated in the embodiment of FIG. 2, the protection layer under the first electrode 134 may include the plurality of polymeric nanoparticles in a bottom emission type OLED display device where the light of the emission layer is emitted through the first electrode of another embodiment shown in FIG. 7 to improve the extraction efficiency of the external light. A refractive index of the plurality of polymeric nanoparticles is different than a refractive index of the protection layer.

Further, although each of the plurality of polymeric nanoparticles has a double layer in the embodiment of FIG. 4, each of the plurality of polymeric nanoparticles may have a multiple layer greater than a triple layer where a refractive index decreases toward a center.

Figure 5:
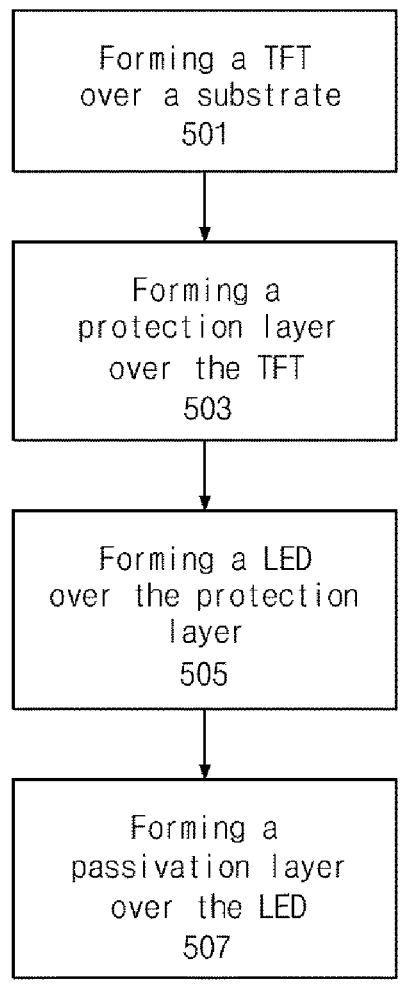
FIG. 5 is a method flow diagram for fabricating an organic light emitting diode display device according to an embodiment.

FIG. 5 illustrates a method of fabricating an organic light emitting diode display device according to one embodiment. The method comprises the steps of forming 501 a TFT over a substrate, forming 503 a protection layer over the TFT, forming 505 a LED over the protection layer 505, and forming 507 a passivation layer over the LED. A second substrate may also be formed over the passivation layer. In one embodiment, either the protection layer or the passivation layer is formed to include a plurality of polymeric nanoparticles that have a refractive index that is different than a refractive index of the passivation layer and a refractive index of the protection layer.

In the present disclosure, consequently, an extraction efficiency of an external light of an OLED display device is improved by forming a plurality of polymeric nanoparticles of a multiple-layered structure in a passivation layer on a light emitting diode.

In addition, an extraction efficiency of an external light of an organic light emitting diode display device is improved and a lifetime is elongated without an addition of a fabrication process and an increase of a fabrication cost by forming a passivation layer including a plurality of polymeric nanoparticles of a multiple-layered structure on a light emitting diode.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the appended claims.

What is claimed is:

1. An organic light emitting diode display device comprising:
   a first substrate;
   a thin film transistor over the first substrate;
   a protection layer over and in contact with the thin film transistor;
   a light emitting diode over the protection layer;
   a passivation layer over the light emitting diode and the protection layer;
   a second substrate over the passivation layer; and
   a plurality of polymeric nanoparticles disposed within the protection layer, wherein a refractive index of the plurality of polymeric nanoparticles is less than a refractive index of the protection layer.

2. The display device of claim 1, wherein at least one of the polymeric nanoparticles comprises a multi-layer structure having multiple layers where a refractive index of the polymeric nanoparticle having the multi-layer structure decreases toward a center of the polymeric nanoparticle.

3. The display device of claim 2, wherein the multi-layer structure having multiple layers comprises:
   a nucleus at the center of the polymeric nanoparticle; and
   a shell surrounding the nucleus;
   wherein a refractive index of the shell is equal to or greater than a refractive index of the nucleus.

4. The display device of claim 3, wherein the nucleus comprises silica and the shell comprises polystyrene.

5. The display device of claim 3, wherein the refractive index of the shell is equal to or less than the refractive index of the protection layer.

6. The display device of claim 1, wherein the passivation layer comprises at least one of a capping layer or a sealing layer that prevents moisture from entering the light emitting diode.

7. The display device of claim 6, wherein the passivation layer has a double layer comprising both the capping layer and the sealing layer.

8. The display device of claim 1, wherein at least one of the plurality of polymeric nanoparticles has a cross-sectional shape of one of a circle or an ellipse.

9. The display device of claim 1, wherein at least one of the plurality of polymeric nanoparticles has a diameter equal to or less than about 1 µm.

10. The display device of claim 1, wherein the plurality of polymeric nanoparticles includes a volume ratio of 10% to 25% with respect to the protection layer.

11. A method of fabricating an organic light emitting diode display device comprising the steps of:
   forming a thin film transistor over a first substrate;
   forming a protection layer over and in contact with the thin film transistor;
   forming a light emitting diode over the protection layer; and
   forming a passivation layer over the light emitting diode and the protection layer;
   forming a second substrate over the passivation layer,
   wherein the protection layer is formed to include a plurality of polymeric nanoparticles, wherein a refractive index of the plurality of polymeric nanoparticles is less than a refractive index of the protection layer.

12. The method of claim 11, wherein at least one of the polymeric nanoparticles comprises a nucleus at a center of the polymeric nanoparticle and a shell surrounding the nucleus, and wherein a refractive index of the shell is equal to or greater than a refractive index of the nucleus.

13. The method of claim 11, wherein the protection layer including the plurality of polymeric nanoparticles is formed through a soluble process.

14. The method of claim 11, wherein forming the passivation layer over the light emitting diode comprises forming at least one of a capping layer or a sealing layer over the light emitting diode.

15. The method of claim 14, wherein forming the passivation layer over the light emitting diode comprises forming a double layer comprising the capping layer and the sealing layer.

16. An organic light emitting diode display device comprising:

a first substrate;

a thin film transistor over the first substrate;

a first layer over and in contact with the thin film transistor;

a light emitting diode over the first layer;

a second layer over the light emitting diode and the first layer; and a plurality of polymeric nanoparticles disposed within the first layer, wherein a refractive index of the plurality of polymeric nanoparticles is less than a refractive index of the first layer.

17. The organic light emitting diode display device of claim 16, further comprising a second substrate over the second layer.

18. The organic light emitting diode display device of claim 16, wherein the first layer is a protection layer and the second layer is a passivation layer.

19. The organic light emitting diode display device of claim 16, wherein at least one of the polymeric nanoparticles comprises a multi-layer structure having multiple layers including:

a first layer at the center of the polymeric nanoparticle; and a second layer surrounding the first layer of the polymeric nanoparticle;

wherein a refractive index of the second layer of the polymeric nanoparticle is equal to or greater than a refractive index of the first layer of the polymeric nanoparticle.

20. The organic light emitting diode display device of claim 16, wherein the plurality of polymeric nanoparticles has a diameter equal to or less than 1 micrometer.

21. The organic light emitting diode display device of claim 16, wherein the plurality of polymeric nanoparticles includes a volume ratio of 10% to 25% with respect to the first layer.

22. The organic light emitting diode display device of claim 18, wherein the passivation layer is multi-layered and the plurality of polymeric nanoparticles are disposed throughout the layers of the passivation layer.

23. The organic light emitting diode display device of claim 16, wherein the plurality of polymeric nanoparticles are disposed in the first layer if the organic light emitting diode display device is a bottom emitting display device.

* * * * *